(12) United States Patent
Hatauchi

(10) Patent No.: US 6,858,920 B2
(45) Date of Patent: Feb. 22, 2005

(54) SEMICONDUCTOR DEVICE WITH STACKED SEMICONDUCTOR ELEMENTS

(75) Inventor: Kazushi Hatauchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/376,269

(22) Filed: Mar. 3, 2003

(65) Prior Publication Data

US 2004/0061203 A1 Apr. 1, 2004

(30) Foreign Application Priority Data

Sep. 26, 2002 (JP) ........................................ 2002-280953

(51) Int. Cl.⁷ ............................................ H01L 23/495
(52) U.S. Cl. ........................ 257/666; 257/686; 257/777
(58) Field of Search ................................. 257/666, 676, 257/678, 686, 777, 781, 787

(56) References Cited

U.S. PATENT DOCUMENTS 6,159,765 A * 12/2000 Drehobl et al. ............. 438/106

FOREIGN PATENT DOCUMENTS

JP 09-232500 9/1997
JP 11-220091 8/1999

* cited by examiner

Primary Examiner—Hoai Pham
(74) Attorney, Agent, or Firm—McDermott Will & Emery LLP

(57) ABSTRACT

In a semiconductor device 1, a substrate 3 carries the first semiconductor element 2a and the second semiconductor element 2b. The first semiconductor element 2a has a plurality of first pads 4a and a plurality of second pads 4b arrayed along two facing sides of a major surface. The second semiconductor element 2b has a plurality of third pads 4c along sides where the first pads 4a and the second pads 4b are arrayed, and a plurality of fourth pads 4d along sides where the first pads 4a and the second pads 4b are not arrayed. First wirings 8 electrically connect the plurality of third pads 4c to the plurality of fourth pads 4d on the major surface. A plurality of electrodes 5 is arrayed along all the circumferential sides of the major surface of the substrate 3. Second wirings 6a electrically connect the plurality of first pads 4a and the plurality of fourth pads 4d respectively to the plurality of electrodes 5. Third wirings 6b electrically connect the plurality of second pads 4b to the plurality of third pads 4c.

3 Claims, 4 Drawing Sheets

Molding resin injecting direction

II-II cross-section

III—III cross-section

SEMICONDUCTOR DEVICE WITH STACKED SEMICONDUCTOR ELEMENTS

BACKGROUND OF THE INVENTION

1. Field of the Invention

The present invention relates to a semiconductor device that can easily assemble semiconductor elements having pads arrayed along two facing sides of the major surface in a package having electrodes arrayed along all the outer circumferential sides of the major surface of a substrate whereon the semiconductor elements are placed.

2. Background Art

In a conventional semiconductor device having a stacked MCM structure, a dummy wiring is formed on an upper semiconductor element, and the electrical signals from a lower semiconductor element are communicated through the dummy wiring to a lead, which is a terminal for external connection. Thereby, the electrical signals from a lower semiconductor element can be guided by the upper semiconductor element (refer to e.g., Japanese Patent Laid-Open No. 11-220091 (pp. 1–4, FIGS. 1–6)).

For the purpose of the reduction of the area of a semiconductor element due to the optimization of a pad arrangement, and to the simultaneous measurement of a large number of semiconductor elements in wafer test, a semiconductor element having pads arrayed along two facing sides of the major surface has recently been manufactured. Other than a semiconductor element designed to have pads on two sides of the major surface from the beginning, a semiconductor element initially designed and manufactured to array pads along four sides of the major surface and assembled on a QFP has been developed, and the design has been changed so as to array pads along two facing sides of the major surface for realizing the reduction of the area of a semiconductor element and the simultaneous measurement of a large number of semiconductor elements in wafer test. Since such a semiconductor element has already been shipped as a QFP and used in a circuit board, it must be assembled in a QFP for maintaining interchangeability with conventional products even if the pad arrangement of semiconductor elements have been changed.

However, although a conventional semiconductor device may not require an expensive multi-layer substrate for assembling by making the upper semiconductor element guide the electrical signals from the lower semiconductor element, an optimal pad layout or wiring method of easily assembling semiconductor elements having pads on two facing sides, whose demand has been increased, in packages having electrodes on four outer circumferential sides, such as QFP, cannot be known from this technique.

SUMMARY OF THE INVENTION

An object of the present invention is to solve the above-described problems, and to provide a semiconductor device wherein a semiconductor element having pads arrayed along two facing sides of the major surface is assembled in a package, such as QFP having electrodes arrayed along all the outer circumferential sides of the major surface of the substrate whereon the semiconductor elements are placed.

According to one aspect of the present invention, a semiconductor device is provided. The semiconductor device comprises a first semiconductor element having a plurality of first pads and a plurality of second pads arrayed along two facing sides of a major surface, a second semiconductor element having a plurality of third pads along sides where the first pads and the second pads are arrayed, a plurality of fourth pads along sides where the first pads and the second pads are not arrayed and first wirings for electrically connecting the plurality of third pads to the plurality of fourth pads on the major surface, a substrate carrying the first semiconductor element and the second semiconductor element, a plurality of electrodes arrayed along all the circumferential sides of the major surface of the substrate, second wirings for electrically connecting the plurality of first pads and the plurality of fourth pads to the plurality of electrodes and third wirings for electrically connecting the plurality of second pads to the plurality of third pads.

Other and further objects, features and advantages of the invention will appear more fully from the following description.

DETAILED DESCRIPTION OF THE PREFERRED EMBODIMENTS

First Embodiment

Figure 1A:
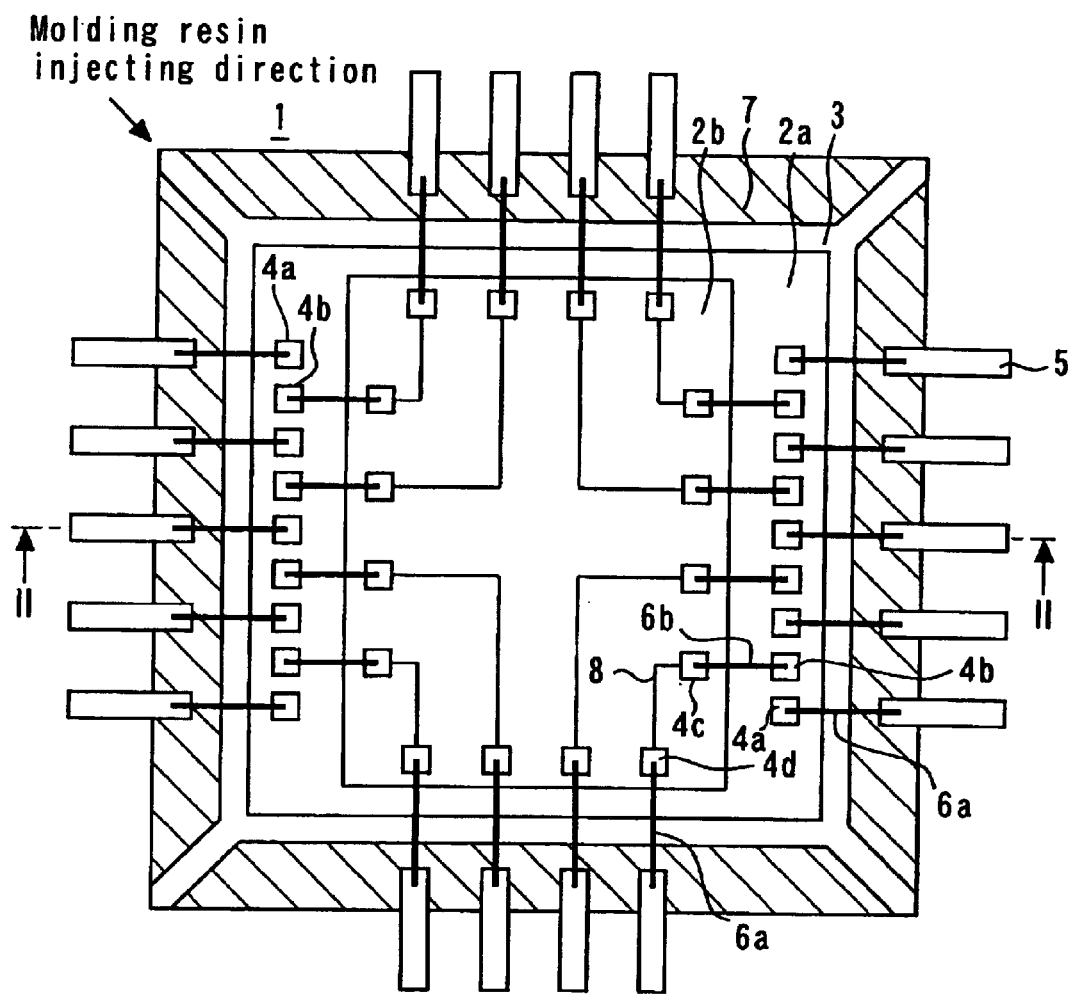
FIG. 1 shows a semiconductor device according to a First Embodiment of the present invention.
Figure 1B:
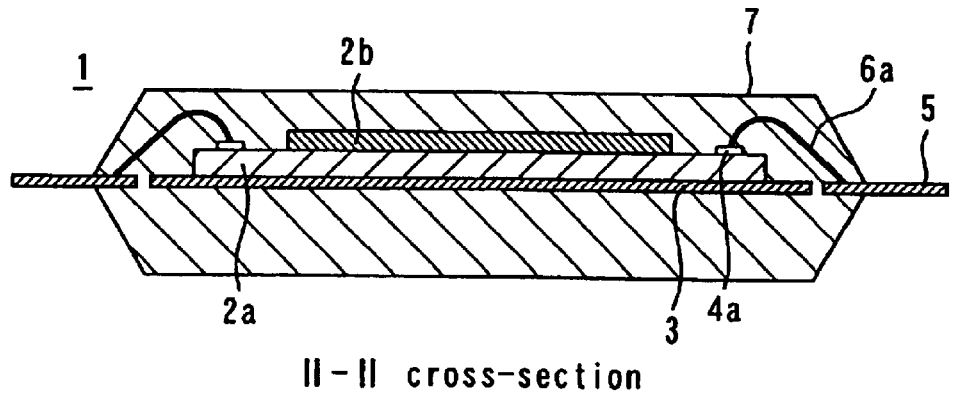

FIG. 1A is a plan showing a semiconductor device according to a First Embodiment of the present invention whose upper portion of a molding resin is cut away; and FIG. 1B is a cross-section thereof along a chain line II—II. In the drawings, reference numeral 1 denotes a semiconductor device. A first semiconductor element 2a has a plurality of first pads 4a and a plurality of second pads 4b arrayed along the two facing sides of the major surface. A second semiconductor element 2b has a plurality of third pads 4c and a plurality of fourth pads 4d. The plurality of third pads 4c are arrayed along sides where the first pads 4a and the second pads 4b are arrayed. The plurality of fourth pads 4d are arrayed along sides where the first pads 4a and the second pads 4b are not arrayed. Aluminum wirings 8 are first wirings for electrically connecting the plurality of third pads 4c to the plurality of fourth pads 4d on the major surface. The aluminum wirings 8 are formed in an interlayer film (not shown) of the second semiconductor element 2b by sputtering or the like. The die pad 3 is a substrate carrying the first semiconductor element 2a and the second semiconductor element 2b. Inner leads 5 are a plurality of electrodes arrayed along all the circumferential sides of the major surface of the substrate 3. Gold wires 6a are second wirings for electrically connecting the plurality of first pads 4a and the plurality of fourth pads 4d to the plurality of electrodes 5. Gold wires 6b are third wirings for electrically connecting the plurality of second pads 4b to the plurality of third pads 4c. A molding resin 7 protects the semiconductor elements 2a, 2b, and gold wires 6a, 6b.

Next, a method of assembling the semiconductor device 1 will be described. Using a die bonder (not shown), the first semiconductor element 2a is bonded to the die pad 3 with an adhesive (not shown). Next, using the same die bonder, the semiconductor element 2b is bonded to the semiconductor element 2a with an adhesive. Next, using a wire bonder, the pads 4a are connected to the inner leads 5, the pads 4b are connected to the pads 4c, and the pads 4d are connected to the inner leads 5, using gold wires 6a, 6b, and 6c, respectively. Next, the die pad 3 carrying the semiconductor element 2a and 2b is placed in a mold (not shown) of a molding apparatus, and the molding resin 7 is injected in the direction described as "Molding resin injecting direction" in FIG. 1A. Finally, the portions of the inner leads 5 protruded out of the molding resin 7 are cut and finished with a lead processing machine (not shown) to complete the semiconductor device 1. As described above, the semiconductor device according to the First Embodiment of the present invention can be manufactured by using existing assembly techniques.

According to the semiconductor device 1 of the First Embodiment of the present invention, since the electrical connection of the pads 4b to the electrodes 5 arrayed along the outer circumferential sides of the major surface of the substrate 3 adjacent to the sides where the pads 4b on the major surface of the first semiconductor element 2a are not arrayed is performed through pads 4c, aluminum wirings 8, and pads 4d, if the pads 4c are disposed on the locations that can be connected easily to the pads 4b to be connected, and the pads 4d are disposed on the locations that can be connected easily to the electrodes 5 to be connected, the semiconductor element 2a having pads 4a and pads 4b arrayed along the two facing sides of the major surface can be assembled easily in a package having electrodes 5 arrayed along all the outer circumferential sides of the major surface of the substrate 3. Since aluminum wirings 8 have substantially no restrictions on wiring layout, pads 4c and pads 4d to be connected can have any positional relationship.

Although the second semiconductor element 2b of the First Embodiment is an exclusive semiconductor element having only pads 4c, 4d and aluminum wirings 8 formed thereon, a semiconductor element having a circuit for realizing other functions whereon only pads 4c, 4d and aluminum wirings 8 are formed may be used as the second semiconductor element 2b. Thereby, the semiconductor element 2b can be utilized more effectively.

Second Embodiment

Figure 2:
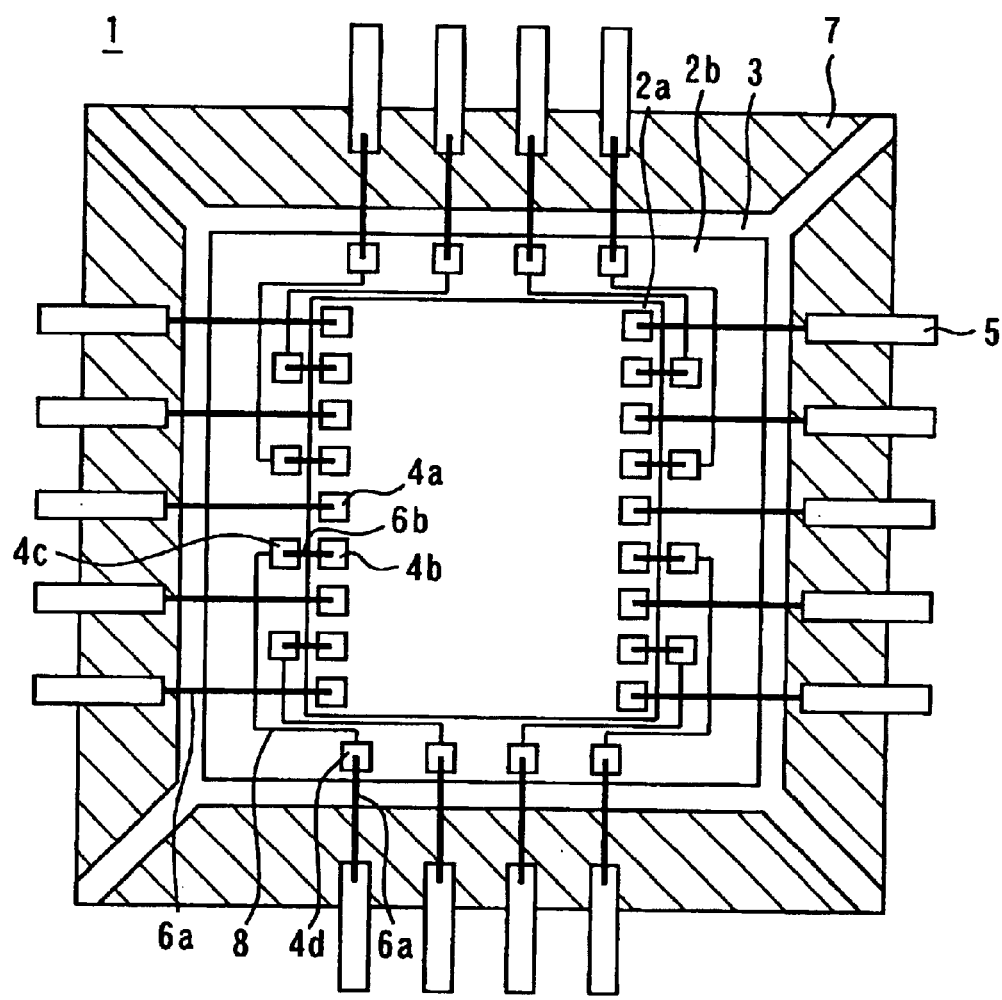
FIG. 2 shows a semiconductor device according to a Second Embodiment of the present invention.

FIG. 2 is a perspective plan showing a semiconductor device according to a Second Embodiment of the present invention whose upper portion of the molding resin is cut away. The parts same as or corresponding to the parts in FIG. 1 are denoted by the same reference numerals, and the description thereof will be omitted. The semiconductor device 1 of the First Embodiment has a second semiconductor element 2b stacked on a first semiconductor element 2a, while the semiconductor device 1 of the Second Embodiment has a first semiconductor element 2a stacked on a second semiconductor element 2b. By adopting this structure, the connection of the pads 4b of the first semiconductor element 2a to the inner leads 5 can be realized through the second semiconductor element 2b even if the second semiconductor element 2b has a larger area than that of the first semiconductor element 2a.

Third Embodiment

Figure 3:
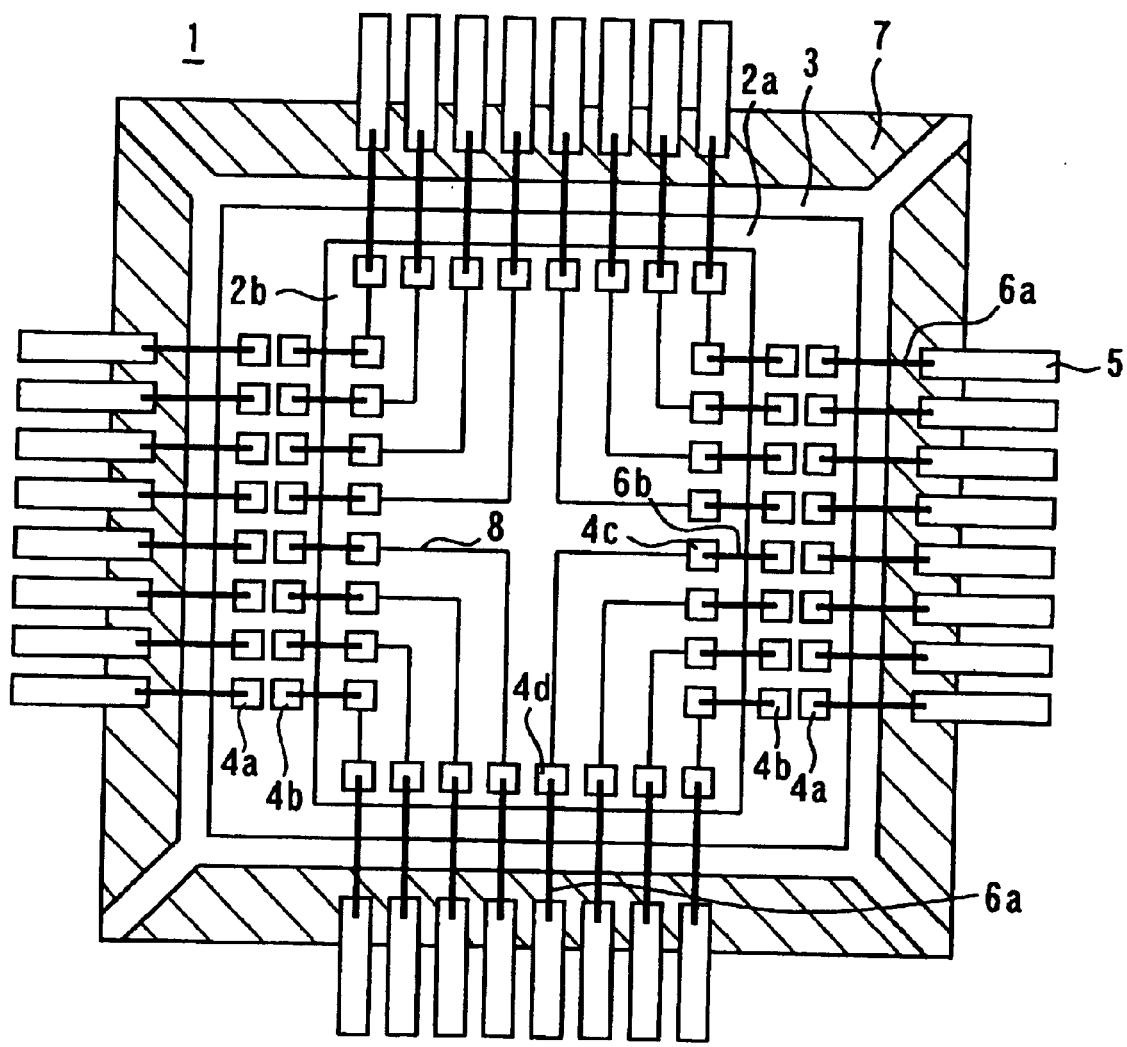
FIG. 3 shows a semiconductor device according to a Third Embodiment of the present invention.

FIG. 3 is a perspective plan showing a semiconductor device according to a Third Embodiment of the present invention whose upper portion of the molding resin is cut away. The parts same as or corresponding to the parts in FIG. 1 are denoted by the same reference numerals, and the description thereof will be omitted. The semiconductor device 1 of the Third Embodiment has two rows of pads 4a and pads 4b on each of two facing sides of a semiconductor element 2a. By adopting this structure, a larger number of pads 4a and pads 4b can be provided on a semiconductor element without damaging easiness of probing in wafer test. Furthermore, three or more rows of pads 4a and pads 4b may be disposed on each side, and thereby, the number of pads that can be disposed can be increased.

Fourth Embodiment

Figure 4A:
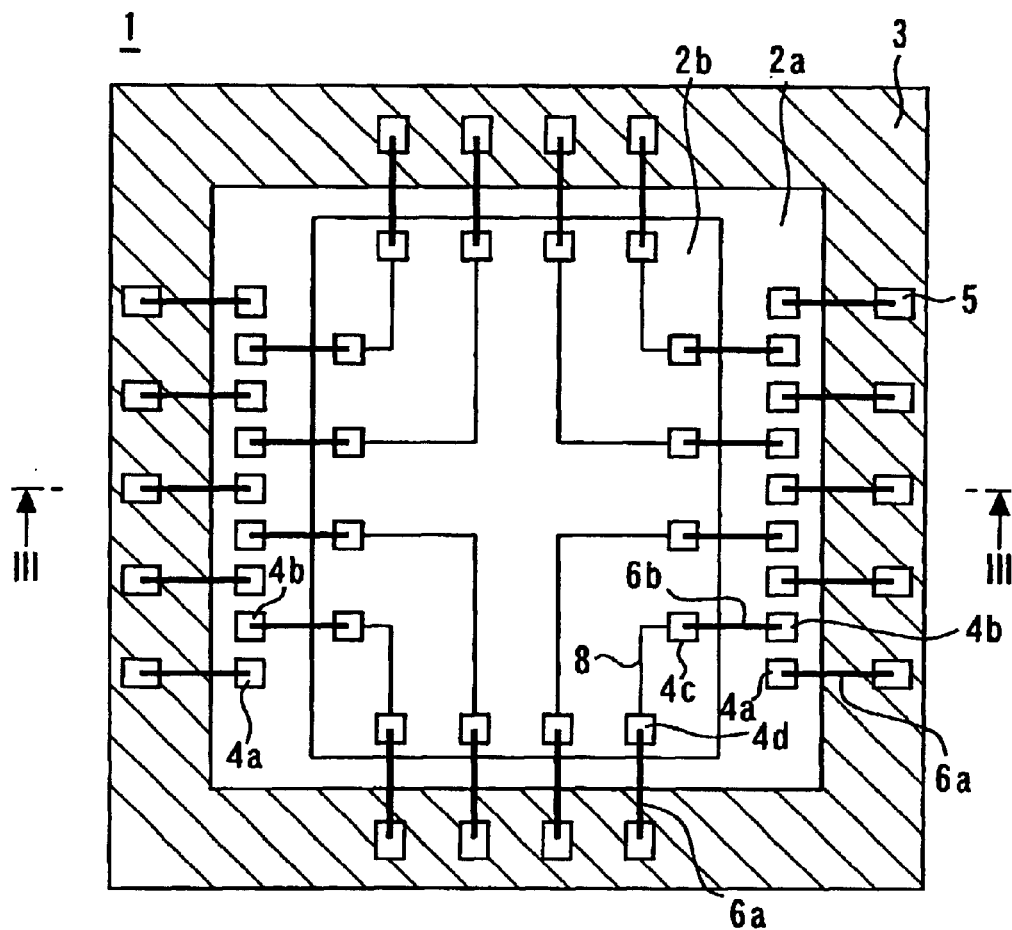
FIG. 4 shows a semiconductor device according to a Fourth Embodiment of the present invention.
Figure 4B:
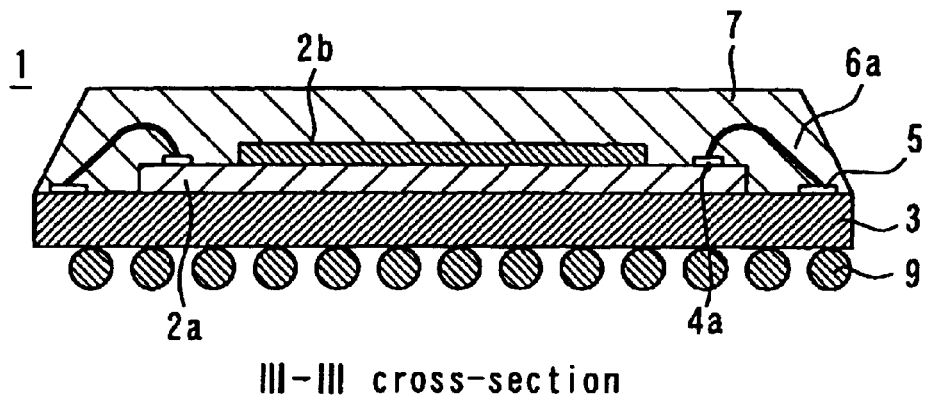

FIG. 4A is a perspective plan showing a semiconductor device according to a Fourth Embodiment of the present invention whose upper portion of the molding resin is cut away; and FIG. 1B is a cross-section thereof along the chain line III—III. In the Fourth Embodiment the constitution of the invention is applied to a BGA (ball grid array), wherein reference numeral 3 denotes a glass-epoxy substrate carrying semiconductor elements 2a and 2b, 5 denotes electrodes provided on the glass-epoxy substrate 3, and 9 denotes solder balls. According to the present invention, semiconductor elements having pads arrayed along two facing sides of the major surface can be assembled easily even in a BGA.

The features and advantages of the present invention may be summarized as follows.

According to one aspect, since the semiconductor device according to the first invention performs electrical connection of the pads on the major surface of the first semiconductor element comprising pads, arrayed along the two facing sides of the major surface, to electrodes arrayed along the outer circumferential sides of the major surface of the substrate adjacent to the side, whereon no pads on the major surface of the first semiconductor element are arrayed, through the first wirings of the second semiconductor element comprising a plurality of pads and the first wirings for electrically connecting a plurality of pads to each other on the major surface, the semiconductor elements having pads arrayed along two facing sides of the major surface can be assembled easily in a package having electrodes arrayed along all the outer circumferential sides of the major surface of the substrate carrying the semiconductor elements.

In the semiconductor device according to the second invention, since the first semiconductor element has two or more rows of pads arrayed along each of the two facing sides of the major surface, the number of pads on a semiconductor element can be increased.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-280953, filed on Sep. 26, 2002 including specification, claims, drawings and summary, on which the Convention priority of the present application is based, are incorporated herein by reference in its entirety.

What is claimed is:

1. A semiconductor device comprising:
   a first semiconductor element having a plurality of first pads and a plurality of second pads arrayed along two facing sides of a major surface;
   a second semiconductor element having a plurality of third pads along sides where the first pads and the second pads are arrayed, a plurality of fourth pads along sides proximate said two sides at which the first pads and the second pads are not arrayed and first wirings for electrically connecting the plurality of third pads to the plurality of fourth pads;
   a substrate carrying the first semiconductor element and the second semiconductor element;
   a plurality of electrodes arrayed along all the circumferential sides of the major surface of the substrate;

second wirings for electrically connecting the plurality of first pads and the plurality of fourth pads to the plurality of electrodes; and third wirings for electrically connecting the plurality of second pads to the plurality of third pads.

2. The semiconductor device according to claim 1, wherein the plurality of first pads and the plurality of second pads are arrayed in at least two rows along each of the two facing sides of the major surface of the first semiconductor element.

3. The semiconductor device according to claim 1, wherein the first semiconductor element and the second semiconductor element are stacked one on top of another.

* * * * *